(12) United States Patent
Ueno

(10) Patent No.: US 10,268,118 B2
(45) Date of Patent: Apr. 23, 2019

(54) EXTREME ULTRAVIOLET LIGHT GENERATING APPARATUS

(71) Applicant: Gigaphoton Inc., Tochigi (JP)

(72) Inventor: Yoshifumi Ueno, Oyama (JP)

(73) Assignee: Gigaphoton Inc., Tochigi (JP)

(*) Notice: Subject to any disclaimer, the term of this patent is extended or adjusted under 35 U.S.C. 154(b) by 0 days.

(21) Appl. No.: 15/945,214

(22) Filed: Apr. 4, 2018

(65) Prior Publication Data

US 2018/0224747 A1  Aug. 9, 2018

Related U.S. Application Data

(63) Continuation of application No. PCT/JP2015/083074, filed on Nov. 25, 2015.

(51) Int. Cl.
*G03F 7/20* (2006.01)
*H05G 2/00* (2006.01)
*G21K 1/06* (2006.01)

(52) U.S. Cl.
CPC ............ *G03F 7/70033* (2013.01); *G03F 7/20* (2013.01); *G03F 7/70175* (2013.01); *G03F 7/70916* (2013.01); *G21K 1/06* (2013.01); *H05G 2/00* (2013.01)

(58) Field of Classification Search
CPC .... G03F 7/20; G03F 7/70033; G03F 7/70175; G03F 7/70916; G21K 1/06; H05G 2/00
See application file for complete search history.

(56) References Cited

U.S. PATENT DOCUMENTS

| 2006/0091109 A1 | 5/2006 | Partlo et al. |
| 2006/0131515 A1 | 6/2006 | Partlo et al. |
| 2007/0228298 A1* | 10/2007 | Komori ............... H05G 2/003 250/493.1 |
| 2011/0199600 A1 | 8/2011 | Soer |

(Continued)

FOREIGN PATENT DOCUMENTS

| JP | 2007-298980 A | 11/2007 |
| JP | 2008-508722 A | 3/2008 |

(Continued)

OTHER PUBLICATIONS

International Search Report issued in PCT/JP2015/083074; dated Jan. 26, 2016.

(Continued)

*Primary Examiner* — David E Smith
*Assistant Examiner* — Hsien C Tsai
(74) *Attorney, Agent, or Firm* — Studebaker & Brackett PC

(57) ABSTRACT

An extreme ultraviolet light generating apparatus includes a light collecting mirror that reflects and focuses extreme ultraviolet light, and a magnet that generates a magnetic field. The light collecting mirror includes a first mirror portion that includes a first reflective surface formed by a portion of a spheroidal surface, and a second mirror portion that includes a second reflective surface having a focal point at substantially the same position as a focal point of the first reflective surface, formed by a portion of a spheroidal surface different from that of the first reflective surface. The second reflective surface is provided at a position at which a magnetic flux density caused by the magnetic field is lower than that of the first reflective surface.

8 Claims, 11 Drawing Sheets

(56) References Cited

U.S. PATENT DOCUMENTS

| | | |
|---|---|---|
| 2011/0309260 A1 | 12/2011 | Nishisaka et al. |
| 2013/0126761 A1 | 5/2013 | Nagai et al. |
| 2013/0228695 A1* | 9/2013 | Mizoguchi ......... G02B 19/0095 |
| | | 250/372 |
| 2014/0001369 A1 | 1/2014 | Nishisaka et al. |

FOREIGN PATENT DOCUMENTS

| | | |
|---|---|---|
| JP | 2012-506133 A | 3/2012 |
| JP | 2013-109854 A | 6/2013 |
| JP | 2013-211517 A | 10/2013 |
| JP | 5670174 B2 | 2/2015 |

OTHER PUBLICATIONS

Written Opinion issued in PCT/JP2015/083074; dated Jan. 26, 2016.

* cited by examiner

EXTREME ULTRAVIOLET LIGHT GENERATING APPARATUS

CROSS REFERENCE TO RELATED APPLICATIONS

The present application is a Continuation application of International Application No. PCT/JP2015/083074 filed on Nov. 25, 2015. The content of the application is incorporated herein by reference in its entirety.

BACKGROUND

1. Technical Field

The present disclosure is related to an extreme ultraviolet light generating apparatus.

2. Related Art

Recently, as semiconductor processes have become finer, transfer patterns for use in photolithography of semiconductor processes have also become finer. In the next generation, microfabrication at 20 nm or less will be in demand. In order to meet this demand, there is expectation for development of an exposure apparatus in which an extreme ultraviolet (EUV) light generating apparatus that generates extreme ultraviolet (EUV) light having a wavelength of approximately 13 nm is combined with a reduced projection reflective optic system.

Three types of EUV light generating apparatuses have been proposed. The three types are: an LPP (Laser Produced Plasma) type apparatus that employs plasma which is generated by a target substance being irradiated with a laser beam; a DPP (Discharge Produced Plasma) type apparatus that employs plasma which is generated by electrical discharge, and an SR (Synchrotron Radiation) type apparatus that employs synchrotron orbital radiation.

RELATED ART DOCUMENTS

Patent Documents

[Patent Document 1]
  Japanese Patent No. 5670174
[Patent Document 2]
  PCT Japanese Publication No. 2012-506133
[Patent Document 3]
  Japanese Unexamined Patent Publication No. 2007-298980
[Patent Document 4]
  Japanese Unexamined Patent Publication No. 2013-211517

SUMMARY

An extreme ultraviolet light generating apparatus according to one aspect of the present disclosure may include a light collecting mirror that reflects and focuses extreme ultraviolet light and a magnet that generates a magnetic field, the light collecting mirror including a first mirror portion that includes a first reflective surface which is formed by a portion of a spheroidal surface and a second mirror portion that includes a second reflective surface having a focal point at substantially the same position as a focal point of the first reflective surface, and is formed by a portion of a spheroid surface different from that of the first reflective surface, the second reflective surface being provided at a position at which a magnetic flux density caused by the magnetic field is lower than that of the first reflective surface.

BRIEF DESCRIPTION OF THE DRAWINGS

Embodiments of the present disclosure will be described below as examples, with reference to the attached drawings.

DETAILED DESCRIPTION OF EXEMPLARY EMBODIMENTS

Figure 1:
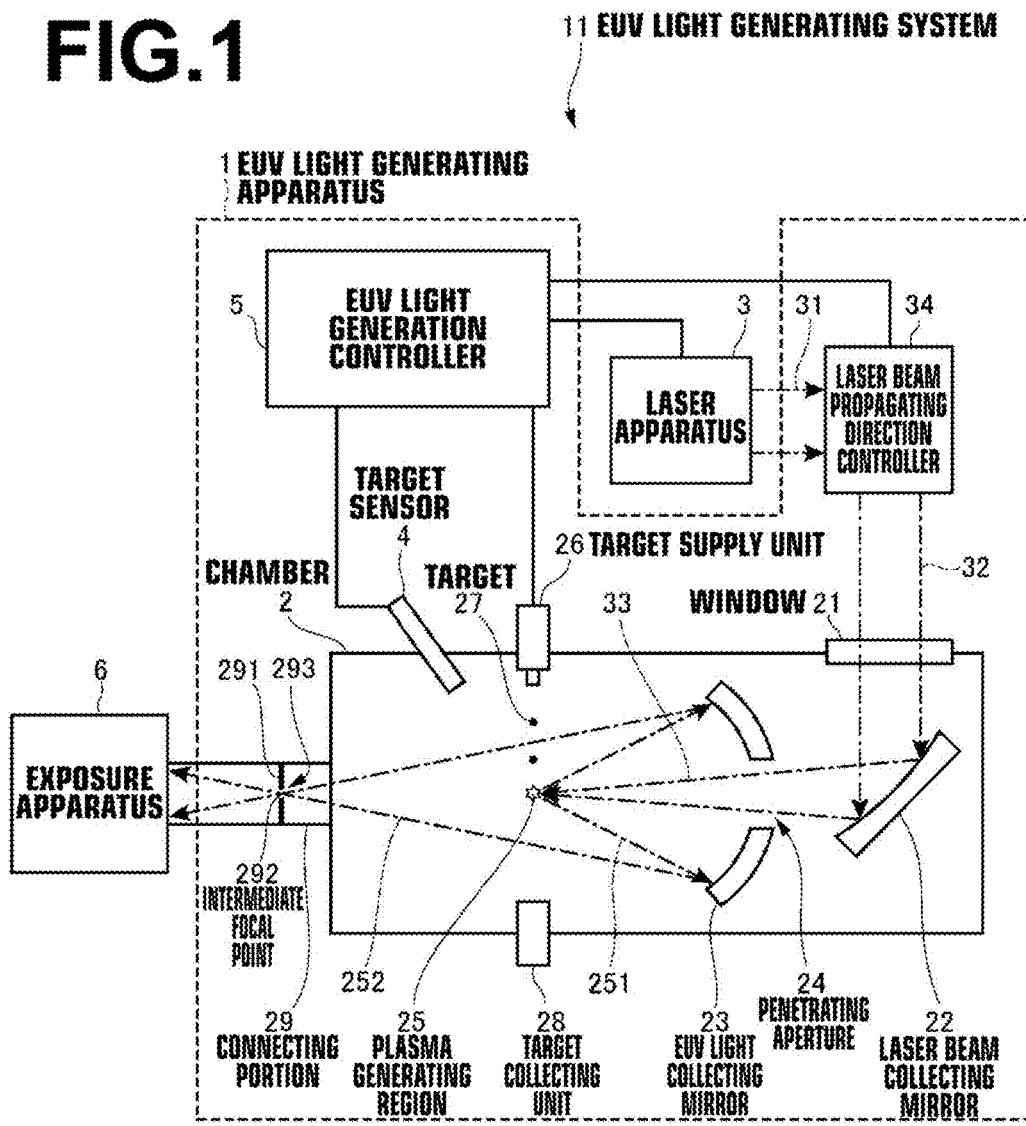
FIG. 1 is a diagram that schematically illustrates the configuration of an exemplary extreme ultraviolet light generating system of the LPP type.

<Contents->
1. Overview of EUV Light Generating System
  1.1 Configuration
  1.2 Operation
2. Terms
3. Problem
  3.1 Configuration of a Comparative Example
  3.2 Operation of the Comparative Example
  3.3 Problem
4. First Embodiment
  4.1 Configuration
  4.2 Operation
  4.3 Functions and Effects 5. Second Embodiment
    5.1 Configuration
    5.2 Operation, Functions, and Effects
6. Other Items Hereinafter, embodiments of the present disclosure will be described in detail while referring to the attached drawings. The embodiments to be described below are illustrative examples of the present disclosure, and do not limit the scope of the present disclosure. In addition, not all of the configurations and operations of the embodiments to be described below are necessarily essential configurations and operations of the present disclosure. Note that common constituent elements will be denoted by the same reference numerals, and redundant descriptions will be omitted.

1. Overview of EUV Light Generating System

[1.1 Configuration]

FIG. 1 is a diagram that schematically illustrates the configuration of an exemplary EUV light generating system of the LPP type.

An EUV light generating apparatus 1 may be employed with at least one laser apparatus 3. A system that includes the EUV light generating apparatus 1 and the laser apparatus 3 will be referred to as an EUV light generating system 11. As illustrated in FIG. 1 and as will be described in detail later, the EUV light generating apparatus 1 may include a chamber 2 and a target supply unit 26. The chamber 2 may be sealable. The target supply unit 26 may be provided such that it penetrates through a wall of the chamber 2, for example. The material which is supplied by the target supply unit 26 as a target 27 may include, tin, terbium, gadolinium, lithium, xenon, or any combination including two or more thereof, but is not limited to these materials.

A wall of the chamber 2 may have at least one penetrating aperture therethrough. A window 21 may be provided at the penetrating aperture. A pulsed laser beam 32 which is output from the laser apparatus 3 may pass through the window 21. An EUV light collecting mirror 23 having a spheroidal reflective surface, for example, may be provided in the chamber 2. The EUV light collecting mirror 23 may have a first focal point and a second focal point. The surface of the EUV light collecting mirror 23 may have a multi layered reflective film, in which molybdenum layers and silicon layers are alternately laminated, formed thereon, for example. It is preferable for the EUV light collecting mirror 23 to be provided such that the first focal point is positioned in a plasma generating region 25, and the second focal point is positioned at an intermediate focal point (IF) 292. The EUV light collecting mirror 23 may have a penetrating aperture 24 formed in the center thereof, and a pulsed laser beam 33 may pass through the penetrating aperture 24.

The EUV light generating apparatus 1 may include an EUV light generation control unit 5, a target sensor 4, and the like. The target sensor 4 may have an image capturing function, and may be configured to detect the presence, the trajectory, the position, the velocity, etc. of a target 27.

In addition, the EUV light generating apparatus 1 may include a connecting portion 29 that causes the interior of the chamber 2 to be in communication with the interior of an exposure apparatus 6. A wall 291 having an aperture 293 may be provided in the connecting portion 29. The wall 291 may be provided such that the aperture 293 is positioned at the second focal point of the EUV light collecting mirror 23.

Further, the EUV light generating apparatus 1 may include a laser beam propagating direction control unit 34, a laser beam collecting mirror 22, a target collecting unit 28 configured to collect the target 27, and the like. The laser beam propagating direction control unit 34 may be equipped with an optical element for regulating the propagating direction of a laser beam, and an actuator for adjusting the position, orientation, etc. of the optical element.

[1.2 Operation]

Referring to FIG. 1, a pulsed laser beam 31 which is output from the laser apparatus 3 may propagate via the laser beam propagating direction control unit 34, pass through the window 21 as the pulsed laser beam 32, and then enter the chamber 2. The pulsed laser beam 32 may propagate through the chamber 2 along at least one laser beam path, be reflected by the laser beam collecting mirror 22, and be radiated to at least one target 27 as the pulsed laser beam 33.

The target supply unit 26 may be configured to output the target 27 toward the plasma generating region 25 in the interior of the chamber 2. The target 27 may be irradiated with at least one pulse which is included in the pulsed laser beam 33. The target 27 which is irradiated with the pulsed laser beam 33 turns into plasma, and EUV light 251 is radiated accompanying radiation of light having other wavelengths. The EUV light 251 may be selectively reflected by the EUV light collecting mirror 23. The EUV light 252 which is reflected by the EUV light collecting mirror 23 may be focused at the intermediate focal point 292 and output to the exposure apparatus 6. Note that a single target 27 may be irradiated with a plurality of pulses which are included in the pulsed laser beam 33.

The EUV light generation control unit 5 may be configured to totally control the entire EUV light generating system 11. The EUV light generation control unit 5 may be configured to process image data or the like of the target 27 captured by the target sensor 4. The EUV light generation control unit 5 may control at least one of the timing at which the target 27 is output, the output direction of the target 27, and the like, for example. The EUV light generation control unit 5 may further control at least one of the output timing of the laser apparatus 3, the propagating direction of the pulsed laser beam 32, the focal position of the pulsed laser beam 33, and the like, for example. The above items which are controlled are merely examples, and other additional items may be controlled as necessary.

2. Terms

A "target" refers to a substance which is introduced into a chamber and is irradiated with a laser beam. The target which is irradiated with the laser beam turns into plasma and emits EUV light.

A "droplet" refers to one form in which the target is supplied into the chamber.

A "plasma generating region" refers to a predetermined region within the chamber. The plasma generating region is a region in which the target which is output into the chamber is irradiated with the laser beam, and the target turns into plasma.

An "axis of an optical path" refers to an axis that passes through the center of the cross section of a laser beam along the direction in which the laser beam propagates.

An "optical path" refers to a path through which the laser beam passes. The optical path may include the axis of the optical path.

3. Problem

An EUV light generating apparatus 1 of a comparative example will be described with reference to FIG. 2 through FIG. 5.

[3.1 Configuration of a Comparative Example]

Figure 2:
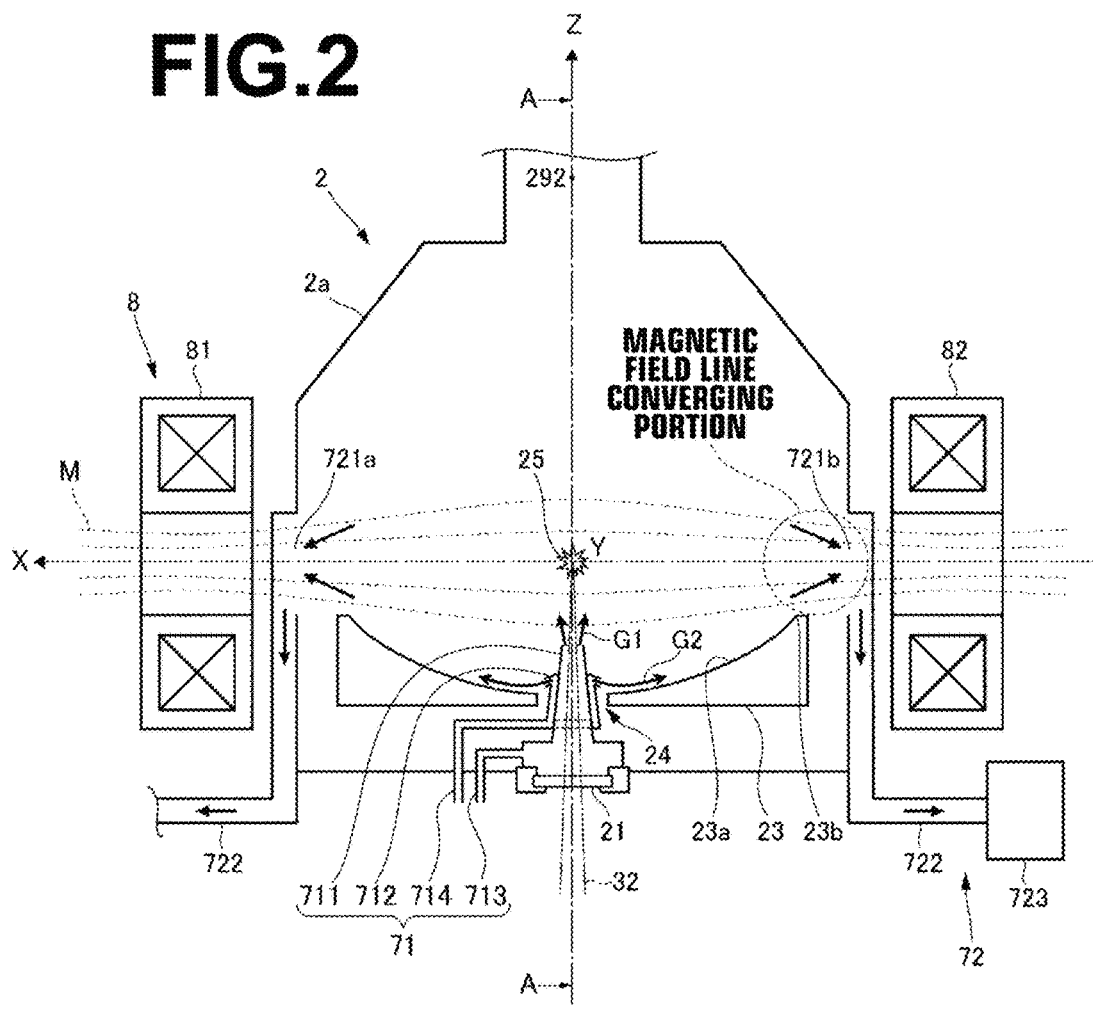
FIG. 2 is a diagram for explaining the configuration of an extreme ultraviolet light generating apparatus of a comparative example.
Figure 3:
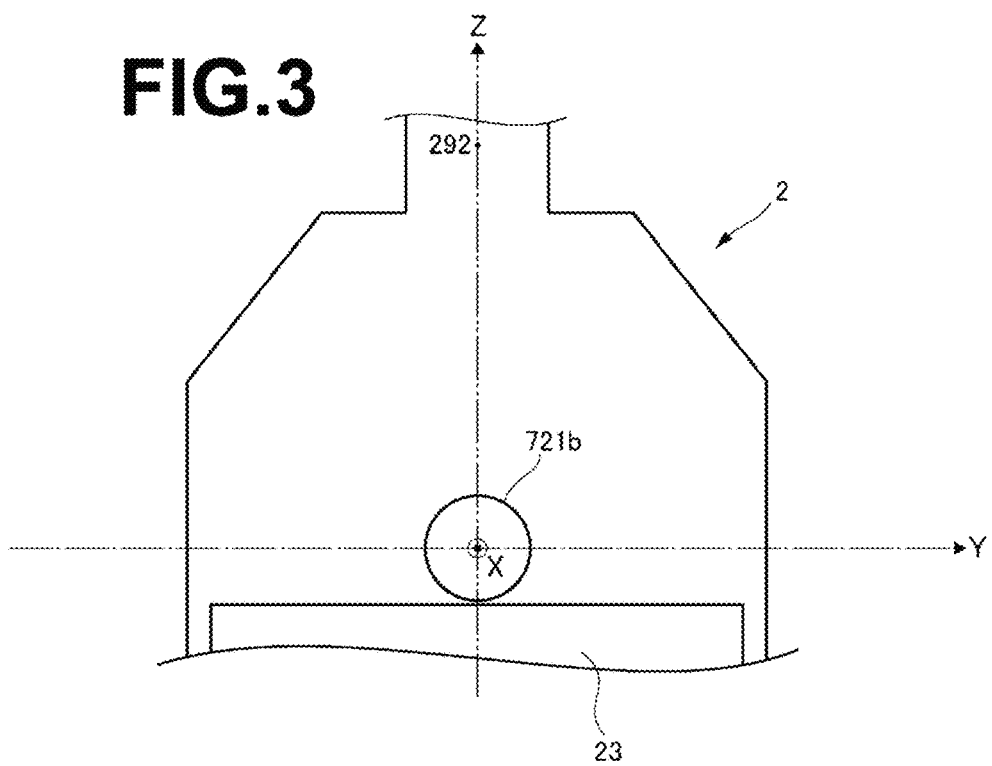
FIG. 3 is a cross sectional diagram taken along line A-A of FIG. 2.

FIG. 2 is a diagram for explaining the configuration of the EUV light generating apparatus 1 of the comparative example. FIG. 3 is a cross sectional diagram taken along line A-A of FIG. 2.

FIG. 2 illustrates a coordinate system having the center of the plasma generating region 25 as its origin.

In FIG. 2, an axis that passes through the plasma generating region 25 and the intermediate focal point 292 is designated as a Z axis. The Z axis may be an axis that passes through a first focal point F1 and a second focal point F2 of a reflective surface 23a of the EUV light collecting mirror 23. The Z axis direction may be a direction from the first focal point F1 toward the second focal point F2. A reverse direction of the Z axis direction may be a direction from the second focal point F2 toward the first focal point F1. The Z axis direction may be a direction in which the EUV light 252 is output from the chamber 2 to the exposure apparatus 6.

In FIG. 2, an axis that passes through the target supply unit 26 and the plasma generating region 25 is designated as a Y axis. The Y axis direction may be a direction in which the target supply unit 26 outputs the target 27 into the chamber 2.

In FIG. 2, an axis that perpendicularly intersects the Y axis and the Z axis is designated as an X axis. The X axis may be the central axis of a magnetic field M which is generated by a magnetic field generating unit 8.

The coordinate system illustrated in FIG. 2 may be utilized in the same manner in FIG. 3 and the subsequent drawings.

The EUV light generating apparatus 1 of the comparative example may include the chamber 2 and the magnetic field generating unit 8.

As described above, the chamber 2 may be a container into which the target 27 is supplied by the target supply unit 26 and within which the target 27 is irradiated with the pulsed laser beam 33 to generate the EUV light 252.

The chamber 2 may be provided with the EUV light collecting mirror 23, a gas supply unit 71, and a gas exhaust unit 72.

The EUV light collecting mirror 23 may selectively reflect light in the vicinity of a specific wavelength within EUV light 251, which is generated at the plasma generating region 25, at a reflective surface 23a thereof. The EUV light collecting mirror 23 may focus the selectively reflected EUV light 251 at the intermediate focal point 292, which is a predetermined focal point, as the EUV light 252.

The reflective surface 23a of the EUV light collecting mirror 23 may be formed by a portion of a spheroidal surface which has first and second focal points F1 and F2.

The first focal point F1 may be positioned at the plasma generating region 25. The second focal point F2 may be positioned at the intermediate focal point 292, which is at a position farther from the reflective surface 23a than the plasma generating region 25.

The gas supply unit 71 may supply gases G1 and G2 into the chamber 2 through the penetrating aperture 24 which is formed in the EUV light collecting mirror 23.

The gas supply unit 71 may include a hood 711, a central head 712, a duct 713, and a duct 714.

The hood 711 may be a member that protects the window 21 from plasma which is generated at the plasma generating region 25.

The hood 711 may be formed to be of a hollow approximately conical shape or a hollow approximately frustoconical shape.

The hood 711 may be formed to cover the periphery of the optical path of the pulsed laser beam 33 which passes through the window 21.

The hood 711 may be formed with the peripheral edge of the window 21 as its base end and such that the distal end thereof protrudes through the penetrating aperture 24 toward the plasma generating region 25 beyond the reflective surface 23a. The hood 711 may be formed to become thinner from the base end positioned at the side of the window 21 toward the distal end positioned toward the side of the plasma generating region 25.

An opening, through which the pulsed laser beam 33 that propagates within the hood 711 passes toward the plasma generating region 25, may be formed at the distal end of the hood 711. The opening which is formed at the distal end of the hood 711 may also function as a supply opening for the gas G1 that flows from within the hood 711 toward the plasma generating region 25.

The base end of the hood 711 may be connected to a gas supply source, which is not illustrated, via the duct 713.

The gas supply source may be a supply source for the gases G1 and G2 that react with the target 27 and generate gaseous reaction products at ambient temperature. In the case that the target 27 is tin, the gases G1 and G2 which are supplied from the gas supply source may be hydrogen gas, hydrogen radical gas, or gas that contains these gases.

The central head 712 may cause the supplied gas G2 to flow toward the reflective surface 23a of the EUV light collecting mirror 23.

The central head 712 may be formed about the entire periphery of the side surface of the hood 711.

A supply opening of the central head 712 may be formed to face the reflective surface 23a in the vicinity of the peripheral edge of the penetrating aperture 24. The shape of the supply opening of the central head 712 may be a slit. However, the shape of the supply opening is not particularly limited, and may be a rectangular shape, a plurality of circular shapes, or other shapes.

The central head 712 may be connected to a gas supply source, which is not illustrated, via the duct 714.

The gas supply source which is connected to the central head 712 may practically be the same as the gas supply source which is connected to the hood 711.

The gas exhaust unit 72 may exhaust gas that includes the gases G1 and G2 within the chamber 2 to the exterior of the chamber 2.

The gas exhaust unit 72 may include a pair of exhaust ports 721a and 721b, exhaust pipes 722, and an exhaust apparatus 723.

The pair of exhaust ports 721a and 721b may be provided at portions of the inner wall of a wall 2a of the chamber 2 that intersect with the central axis X of the magnetic field M.

The pair of exhaust ports 721a and 721b may be provided to face each other along the central axis X of the magnetic field M. The pair of exhaust ports 721a and 721b may be provided such that the respective central axes thereof are substantially aligned. The pair of exhaust ports 721a and 721b may be provided such that the respective central axes thereof are substantially aligned with the central axis X of the magnetic field M. The pair of exhaust ports 721a and 721b may be provided such that the respective central axes thereof pass through the first focal point F1 which is positioned at the plasma generating region 25.

The pair of exhaust ports 721a and 721b may be connected to the exhaust apparatus 723 respectively via the exhaust pipes 722.

The exhaust apparatus 723 may suction the gas that includes the gases G1 and G2 from within the chamber 2, and exhaust the gas to the exterior of the chamber 2.

The magnetic field generating unit 8 may generate the magnetic field M within the chamber 2.

The magnetic field generating unit 8 may include a pair of magnets 81 and 82.

The pair of magnets 81 and 82 may generate the magnetic field M, which is a mirror magnetic field that surrounds the plasma generating region 25.

Each of the pair of magnets 81 and 82 may be an electromagnet. Each of the pair of magnets 81 and 82 may be formed by winding coils around a torus shaped core. Each of the pair of magnets 81 and 82 may be a superconducting electromagnet.

The pair of magnets 81 and 82 may be provided outside the wall 2a of the chamber 2.

The pair of magnets 81 and 82 may be arranged such that they face each other with the plasma generating region 25, at which the first focal point F1 is positioned, interposed therebetween.

In the magnetic field M which is generated by the pair of magnets 81 and 82, a magnetic flux density in the vicinities of the pair of magnets 81 and 82 may be higher than a magnetic flux density in the vicinity of the plasma generating region 25.

The magnetic field lines of the magnetic field M may be formed such that they converge in the vicinities of the pair of magnets 81 and 82.

A portion of the magnetic field lines of the magnetic field M may be formed along the reflective surface 23a of the EUV light collecting mirror 23. Specifically, a portion of the magnetic field lines of the magnetic field M may be formed substantially parallel to the reflective surface 23a to a degree that a region that practically traps ions I within the magnetic field M due to the function of the magnetic field M does not intersect with the reflective surface 23a.

The magnetic flux density caused by the magnetic field M may decrease at positions farther away from the central axis X of the magnetic field M in the Z axis direction and the reverse direction of the Z axis direction. In other words, the magnetic flux density caused by the magnetic field M at the position at which the reflective surface 23a is provided may decrease at positions along the reflective surface 23a which are farther away from the central axis X of the magnetic field M in the reverse direction of the Z axis direction.

The central axis X of the magnetic field M may pass through the first focal point F1 positioned at the plasma generating region 25 and intersect with the wall 2a of the chamber 2.

Note that the magnetic field generating unit 8 may generate an inequiaxial magnetic field.

[3.2 Operation of the Comparative Example]

The gas supply unit 71 may supply the gas G1 to the interior of the hood 711 from the gas supply source, which is not illustrated, via the duct 713.

The gas G1 which is supplied into the hood 711 may flow along the surface of the window 21 toward the side of the interior of the chamber 2. The gas G1 may be jetted toward the plasma generating region 25 within the chamber 2 from the opening at the distal end of the hood 711. Then, the gas G1 may be exhausted to the exterior of the chamber 2 from the pair of exhaust ports 721a and 721b, which are provided in the wall 2a of the chamber 2.

The gas supply unit 71 may supply the gas G2 to the interior of the central head 712 from the gas supply source, which is not illustrated, via the duct 714.

The gas G2 which is supplied into the central head 712 may be blown onto the reflective surface 23a in the vicinity of the peripheral edge of the penetrating aperture 24 from the supply opening of the central head 712. The gas G2 may be blown across substantially the entire periphery of the reflective surface 23a. The gas G2 which is blown onto the reflective surface 23a may flow along the reflective surface 23a from the vicinity of the peripheral edge of the penetrating aperture 24 toward an outer peripheral edge portion 23b of the reflective surface 23a. Then, the gas G2 may be exhausted to the exterior of the chamber 2 from the pair of exhaust ports 721a and 721b.

The exhaust apparatus 723 may suction the gas within the chamber 2 at the same mass flow rate as the mass flow rate of the gases G1 and G2 which are supplied by the gas supply unit 71, and exhaust the gas to the exterior of the chamber 2.

The pressure within the chamber 2 may be maintained to be substantially constant.

The target 27 which is supplied to the plasma generating region 25 may generate plasma when irradiated with the pulsed laser beam 33. At this time, the plasma may radiate ions I of the target and atoms of the target 27, in addition to the EUV light 251. In the case that the target 27 is tin, the ions I which radiate from the plasma may be tin ions, and the atoms which radiate from the plasma may be tin atoms.

The ions I which radiate from the plasma receive Lorentz force by the function of the magnetic field M generated by the pair of magnets 81 and 82, and may travel along the magnetic field lines of the magnetic field M while undergoing spiral motion. Then, the ions I may travel from the plasma generating region 25 toward the wall 2a of the chamber 2 where the pair of magnets 81 and 82 are arranged. The ions I may reach the pair of exhaust ports 721a and 721b, and may be exhausted to the exterior of the chamber 2 along with the gases G1 and G2.

A majority of the atoms of the target 27 may flow with the gases G1 and G2, travel toward the pair of exhaust ports 721a and 721b, and be exhausted to the exterior of the chamber 2 along with the gases G1 and G2.

A portion of the atoms of the target 27 may be caused to travel toward the interior of the hood 711. However, the momentum of the gas G1 which is jetted out from the hood 711 may prevent such travel.

Even if a portion of the atoms of the target 27 travels into the hood 711, adheres to the surface of the window 21, and becomes debris, the adhered debris may react with the gas G1 and be etched. That is, the adhered debris may react with the gas G1, which has high reactive properties therewith, and may be removed from the surface of the window 21 by changing into a gaseous reaction product at ambient temperature. The etched debris may travel from the interior of the hood 711 along with the gas G1 that flows within the hood 711 toward the pair of exhaust ports 721a and 721b, and may be exhausted to the exterior of the chamber 2 along with the gases G1 and G2.

Note that in the case that the target 27 is tin and the gases G1 and G2 are gases that contain hydrogen gas, stannane ($SnH_4$) gas may be generated as a reaction product if the adhered debris and the gas G1 react.

In addition, a portion of the atoms of the target 27 may be caused to travel onto the reflective surface 23a of the EUV light collecting mirror 23. However, the momentum of the gas G2 which is blown from the central head 712 toward the reflective surface 23a may prevent such travel.

Even if a portion of the atoms of the target 27 travels onto the reflective surface 23a, adheres to the reflective surface 23a, and becomes debris, the adhered debris may react with the gas G2 and be etched. That is, the adhered debris may react with the gas G2, which has high reactive properties therewith, and may be removed from the reflective surface 23a by changing into a gaseous reaction product at ambient temperature. The etched debris may travel with the gas G2 that flows along the reflective surface 23a toward the pair of exhaust ports 721a and 721b, and may be exhausted to the exterior of the chamber 2 along with the gases G1 and G2.

[3.3 Problem]

Figure 4:
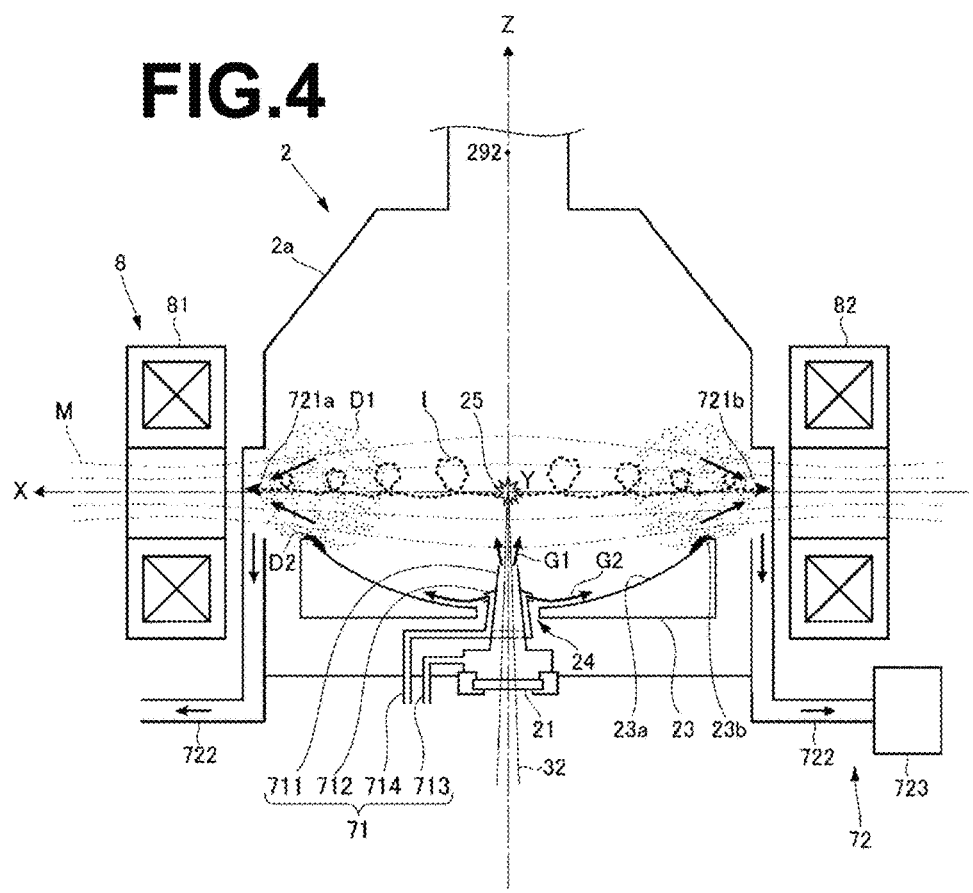
FIG. 4 is a diagram for explaining a problem of the extreme ultraviolet generating apparatus of the comparative example.
Figure 5:
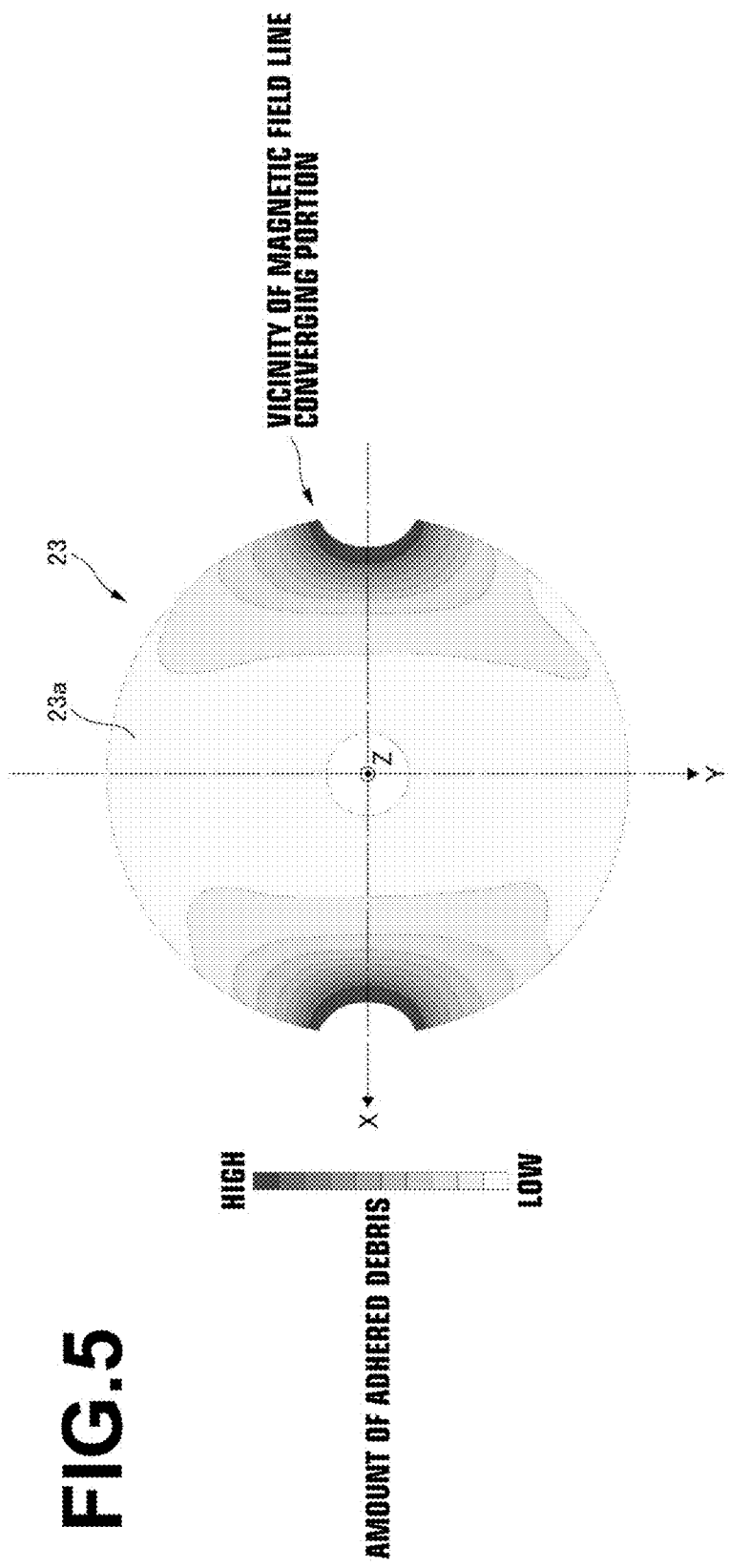
FIG. 5 is a diagram that illustrates the distribution of debris which is adhered onto a reflective surface of an EUV light collecting mirror.

FIG. 4 is a diagram for explaining a problem of the EUV light generating apparatus 1 of the comparative example. FIG. 5 is a diagram that illustrates the distribution of debris which is adhered onto the reflective surface 23a of the EUV light collecting mirror 23.

The ions I that radiate from the plasma may travel from the plasma generating region 25 toward the pair of exhaust ports 721a and 721b by the function of the magnetic field M, as described above.

However, there are cases in which a portion of the ions I that radiate from the plasma become deactivated by colliding with the gases G1 and G2 in the vicinity of the outer peripheral edge portion 23b of the EUV light collecting mirror 23, and become neutralized by electron recombination. In such cases, the function of the magnetic field M may not affect the neutralized ions I, and the neutralized ions I may be retained in the magnetic field line converging portion of the magnetic field M.

In addition, a portion of the atoms of the target 27 that radiate from the plasma may also be retained at the magnetic field line converging portion of the magnetic field M, by the function of the magnetic field M not affecting the portion of the atoms of the target 27 in a manner similar to that for the neutralized ions I.

The neutralized ions I and the atoms of the target 27 which are retained at the magnetic field line converging portion of the magnetic field M are also referred to as fine particle debris D1.

The fine particle debris D1 may diffuse form the magnetic field line converging portion of the magnetic field M.

A majority of the diffused fine particle debris D1 may be exhausted to the exterior of the chamber 2 along with the gases G1 and G2 as described above.

However, a portion thereof may adhere to the reflective surface 23a of the EUV light collecting mirror 23.

The fine particle debris D1 which adheres to the reflective surface 23a may be etched by the gas G2.

However, the fine particle debris D1 which adheres to the reflective surface 23a may not be completely etched by the gas G2, and a portion thereof may remain adhered on the reflective surface 23a.

The fine particle debris D1 which remains adhered to the reflective surface 23a is also referred to as adhered debris D2.

As illustrated in FIG. 5, the adhered debris D2 may have a tendency to increase at positions of the reflective surface 23a close to the magnetic field line converging portion of the magnetic field M.

If the adhered debris D2 is present, the reflectance of the EUV light collecting mirror 23 will decrease, and the output of the EUV light 252 may decrease. If the output of the EUV light 252 becomes less than a predetermined critical value, it may become necessary to replace the EUV light collecting mirror 23 of the EUV light generating apparatus 1.

Accordingly, if the amount of adhered debris D2 increases, the frequency at which the EUV light collecting mirror 23 is to be replaced will increase, and the running cost of the EUV light generating apparatus 1 may increase.

Therefore, a technique, which is capable of suppressing the adhered debris D2, thereby suppressing the running cost of the EUV light generating apparatus 1, is desired.

4. First Embodiment

An EUV light generating apparatus 1 according to a first embodiment will be described with reference to FIG. 6 through FIG. 12.

The EUV light generating apparatus 1 of the first embodiment may differ from the EUV light generating apparatus 1 of the comparative example in the configuration of the EUV light collecting mirror 23.

Specifically, the EUV light collecting mirror 23 of the first embodiment may include a first mirror portion 91 and a second mirror portion 92.

The second mirror portion 92 may be a portion of the EUV light collecting mirror 23 in the vicinity of the magnetic field line converging portion of the magnetic field M. The portion of the EUV light collecting mirror 23 of the comparative example that corresponds to the second mirror portion 92 may be the portion of the reflective surface 23a at which the adhered debris D2 is likely to be formed.

The first mirror portion 91 may be a portion of the EUV light collecting mirror 23 other than the second mirror portion 92. The portion of the EUV light collecting mirror 23 of the comparative example that corresponds to the first mirror portion 91 may be the portion of the reflective surface 23a at which the adhered debris D2 is not likely to be formed.

The EUV light collecting mirror 23 of the first embodiment may be configured such that the second mirror portion 92, which corresponds to the portion where the adhered debris D2 is likely to be formed in the EUV light collecting mirror 23 of the comparative example, is positioned remote from the central axis X of the magnetic field M. In other words, in the EUV light collection mirror 23 of the first embodiment, the second mirror portion 92, which corresponds to the portion where the adhered debris D2 is likely to be formed, may be provided at a position at which the magnetic flux density caused by the magnetic field M is lower than that at the first mirror portion 91, which corresponds to the portion where the adhered debris D2 is not likely to be formed.

Descriptions of the structures in the configuration of the EUV light generating apparatus 1 according to the first embodiment which are the same as those of the EUV light generating apparatus 1 of the comparative example will be omitted.

[4.1 Configuration]

Figure 6:
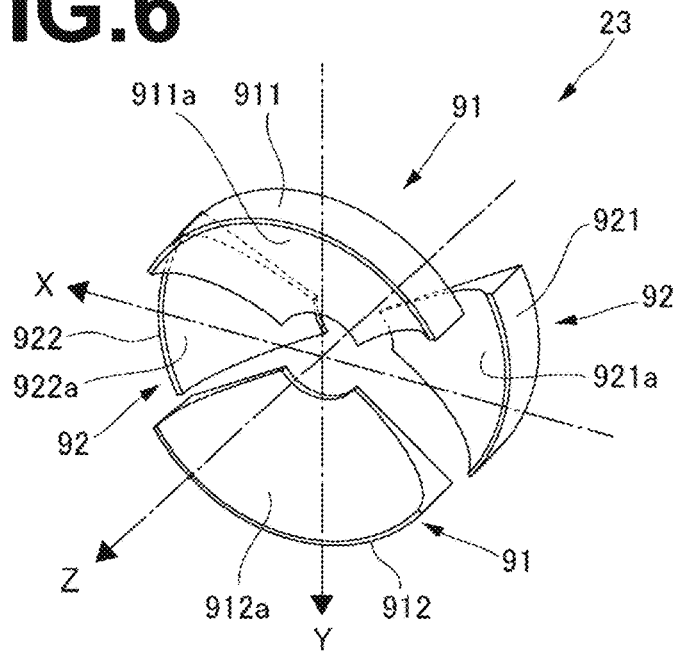
FIG. 6 is a perspective view of an EUV light collecting mirror according to a first embodiment.
Figure 7:
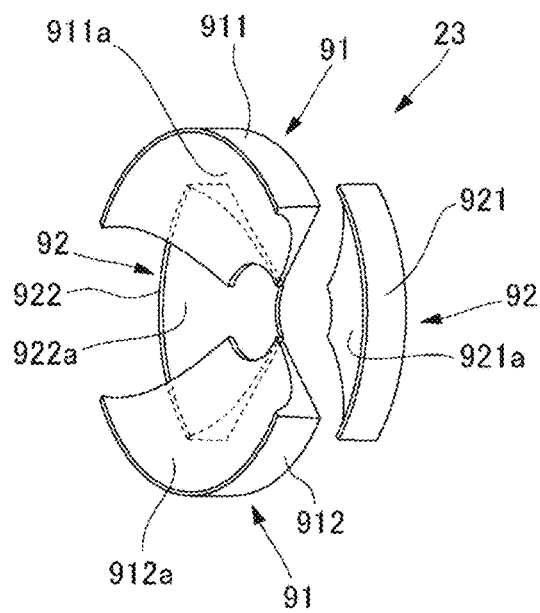
FIG. 7 is a perspective view of the EUV light collecting mirror illustrated in FIG. 6, from a viewpoint different from that of FIG. 6.
Figure 8:
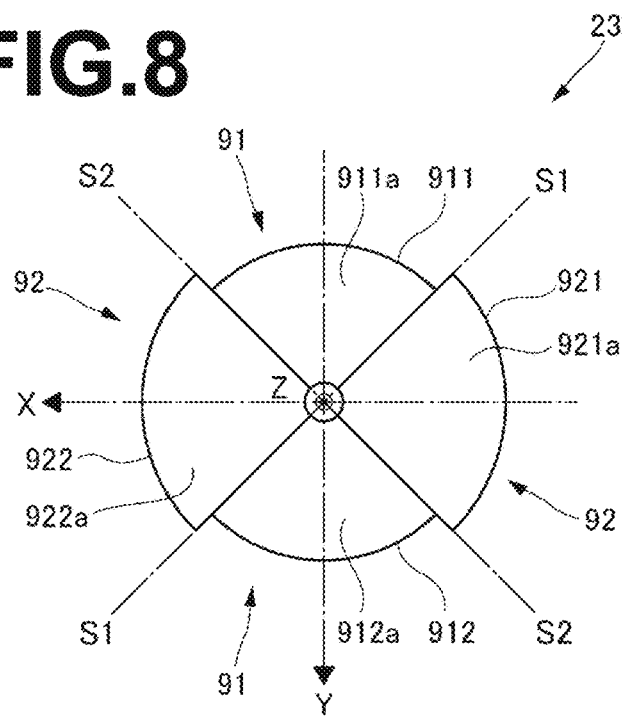
FIG. 8 is a diagram of the EUV light collecting mirror illustrated in FIG. 6 as viewed from a reverse direction of a Z axis direction.
Figure 9:
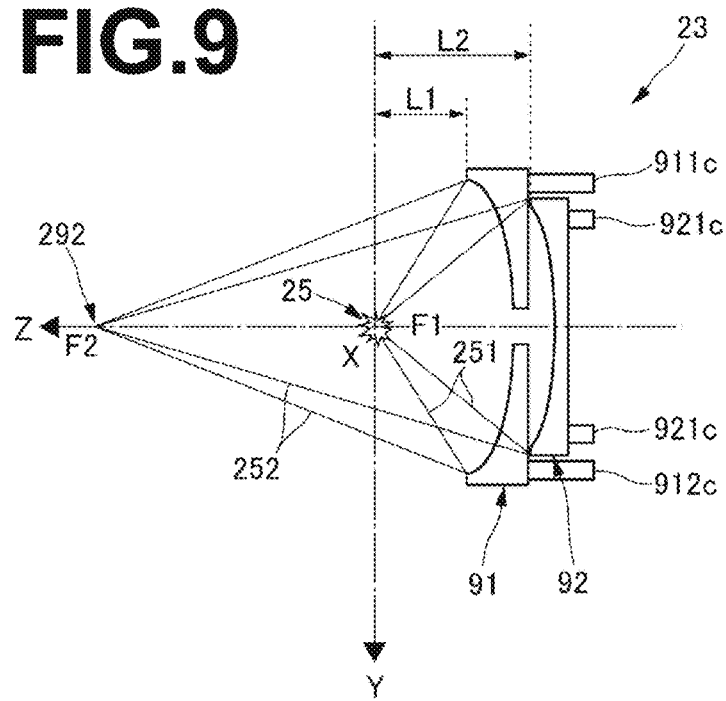
FIG. 9 is a diagram of the EUV light collecting mirror illustrated in FIG. 6 as viewed from an X axis direction.
Figure 10:
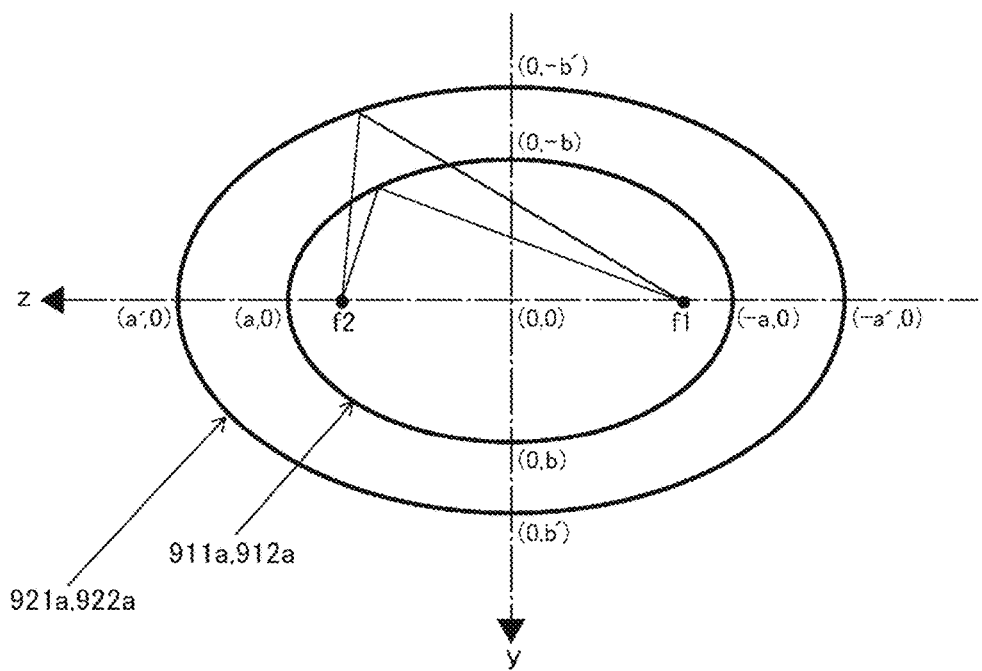
FIG. 10 is a diagram for explaining spheroidal surfaces that form reflective surfaces of the EUV light collecting mirror of FIG. 6 by substituting the spheroidal surfaces with two dimensional elliptical surfaces.

FIG. 6 is a perspective view of the EUV light collecting mirror 23 according to the first embodiment. FIG. 7 is a perspective view of the EUV light collecting mirror 23 illustrated in FIG. 6, from a viewpoint different from that of FIG. 6. FIG. 8 is a diagram of the EUV light collecting mirror 23 illustrated in FIG. 6 as viewed from the reverse direction of the Z axis direction. FIG. 9 is a diagram of the EUV light collecting mirror 23 illustrated in FIG. 6 as viewed from the X axis direction. FIG. 10 is a diagram for explaining spheroidal surfaces that form reflective surfaces of the EUV light collecting mirror 23 of FIG. 6 by employing two dimensional ellipses.

The first mirror portion 91 of the first embodiment may be constituted by a pair of first mirrors 911 and 912. The pair of first mirrors 911 and 912 may be provided at the inner side of the wall 2a of the chamber 2 via first mirror holding units 911c and 912c, respectively.

The second mirror portion 92 of the first embodiment may be constituted by a pair of second mirrors 921 and 922. The pair of second mirrors 921 and 922 may be provided at the inner side of the wall 2a of the chamber 2 via second mirror holding units 921c and 922c, respectively.

The EUV light collecting mirror 23 of the first embodiment may be constituted by arranging the first mirror 911, the second mirror 921, the first mirror 912, and the second mirror 922 in this order about the Z axis.

The pair of first mirrors 911 and 912 may be EUV light collecting mirrors that selectively reflect the EUV light 251 and focus the reflected EUV light 251 at the intermediate focal point 292 as the EUV light 252, in the same manner as the EUV light collecting mirror 23 of the comparative example.

The pair of first mirrors 911 and 912 may be formed to be substantially fan shaped plate shapes which are substantially the same as each other, as illustrated in FIG. 6 through FIG. 8. That is, the pair of first mirrors 911 and 912 may be formed such that the respective central angles thereof are substantially the same.

The pair of first mirrors 911 and 912 may be formed such that the sizes thereof in the radial direction are substantially the same as that of the EUV light collecting mirror 23 of the comparative example.

Cutouts which are of substantially the same shape as portions of the penetrating aperture 24 may be formed at the central portions of the substantial fan shapes of the pair of first mirrors 911 and 912.

The outer peripheral edge portions of the pair of first mirrors 911 and 912 may be formed to be of the same shape as the outer peripheral edge portion of the EUV light collecting mirrors 23 of the comparative example.

The pair of first mirrors 911 and 912 may be arranged along the Y axis.

The pair of first mirrors 911 and 912 may be arranged such that the central portions of the substantial fan shapes thereof face each other with the Z axis interposed therebetween. The pair of first mirrors 911 and 912 may be arranged such that the distances from the cutouts thereof to the Z axis are substantially the same.

The pair of first mirrors 911 and 912 may be arranged between the pair of second mirrors 921 and 922 in a direction along the central axis X of the magnetic field M.

The pair of first mirrors 911 and 912 may be arranged such that a distance L1 from each of the outer peripheral edge portions of reflective surfaces 911a and 912a to the central axis X in the Z axis direction is substantially the same as the distance from the outer peripheral edge portion 23b to the central axis X in the Z axis direction in the comparative example, as illustrated in FIG. 9.

Note that the reflective surfaces 911a and 912a may respectively be the reflective surfaces of the pair of first mirrors 911 and 912.

The reflective surfaces 911a and 912a may constitute a first reflective surface, which is the reflective surface of the first mirror portion 91.

The reflective surfaces 911a and 912a may be formed as portions of spheroidal surfaces which are substantially the same as each other, as illustrated in FIG. 9 and FIG. 10.

The reflective surfaces 911a and 912a may be formed as portions of a spheroidal surface having the first focal point F1 and the second focal point F2 in the same manner as the reflective surface 23a of the comparative example.

That is, the first focal point F1 of each of the reflective surfaces 911a and 912a may be positioned at the plasma generating region 25. The second focal point F2 of each of the reflective surfaces 911a and 912a may be positioned at the intermediate focal point 292, which is a position farther from the reflective surfaces 911a and 912a than the plasma generating region 25.

The spheroidal surface that forms the reflective surfaces 911a and 912a may be substantially the same as the spheroidal surface that forms the reflective surface 23a of the comparative example.

The pair of second mirrors 921 and 922 may be EUV light collecting mirrors that selectively reflect the EUV light 251 and focus the reflected EUV light 251 at the intermediate focal point 292 as the EUV light 252, in the same manner as the pair of first mirrors 911 and 912.

The pair of second mirrors 921 and 922 may be formed to be substantially fan shaped plate shapes which are substantially the same as each other, as illustrated in FIG. 6 through FIG. 8. That is, the pair of second mirrors 921 and 922 may be formed such that the respective central angles thereof are substantially the same.

The pair of second mirrors 921 and 922 may be formed such that the sizes thereof in the radial direction are greater than those of the first pair of mirrors 911 and 912.

Cutouts which are of substantially the same shape as portions of the penetrating aperture 24 may be formed at the central portions of the substantial fan shapes of the pair of second mirrors 921 and 922.

The outer peripheral edge portions of the pair of second mirrors 921 and 922 may be formed to be of the same shape as the outer peripheral edge portion of the EUV light collecting mirror 23.

The pair of second mirrors 921 and 922 may be arranged along the central axis X of the magnetic field M.

The pair of second mirrors 921 and 922 may be arranged such that the central portions of the substantial fan shapes thereof face each other with the Z axis interposed therebetween. The pair of second mirrors 921 and 922 may be arranged such that the distances from the cutouts thereof to the Z axis are substantially the same.

The pair of second mirrors 921 and 922 may be arranged between the pair of first mirrors 911 and 912 in a direction along the Y axis.

The pair of second mirrors 921 and 922 may be arranged such that a distance L2 in the Z axis direction from each of the outer peripheral edge portions of reflective surfaces 921a and 922a to the central axis X is greater than the aforementioned distance L1, as illustrated in FIG. 9. That is, the pair of second mirrors 921 and 922 may be arranged to be farther from the central axis X of the magnetic field M in the reverse direction of the Z axis direction than the pair of first mirrors 911 and 912.

As described in connection with the comparative example, the magnetic flux density caused by the magnetic field M at the position where the reflective surface 23a is present may decrease with increasing distance of the reflective surface 23a from the central axis X of the magnetic field M in the reverse direction of the Z axis direction.

That is, the reflective surfaces 921a and 922a may be arranged at positions in the reverse direction of the Z axis direction at which the magnetic flux density caused by the magnetic field M is lower than that at the reflective surfaces 911a and 912a.

Note that the reflective surfaces 921a and 922a may respectively be the reflective surfaces of the pair of second mirrors 921 and 922.

The reflective surfaces 921a and 922a may constitute a second reflective surface, which is the reflective surface of the second mirror portion 92.

The reflective surfaces 921a and 922a may be formed as portions of spheroidal surfaces which are substantially the same as each other, as illustrated in FIG. 9 and FIG. 10.

The reflective surfaces 921a and 922a may be formed as portions of a spheroidal surface having the first focal point F1 and the second focal point F2 in the same manner as the reflective surfaces 911a and 912a.

That is, the first focal point F1 of each of the reflective surfaces 921a and 922a may be at the same position as the focal point F1 of each of the reflective surfaces 911a and 912a, and may be positioned at the plasma generating region 25. The second focal point F2 of each of the reflective surfaces 921a and 922a may be at the same position as the second focal point F2 of each of the reflective surfaces 911a and 912a, and may be positioned at the intermediate focal point 292, which is a position farther from the reflective surfaces 921a and 922a than the plasma generating region 25.

However, the spheroidal surface that forms the reflective surfaces 921a and 922a may be different from the spheroidal surface that forms the reflective surfaces 911a and 912a. The spheroidal surface that forms the reflective surfaces 921a and 922a may be larger than the spheroidal surface that forms the reflective surfaces 911a and 912a.

Here, the spheroidal surfaces that form the reflective surfaces 911a and 912a as well as the reflective surfaces 921a and 922a will be considered employing two dimensional ellipses, in order to simplify the description.

For example, assume that a first ellipse has a first focal point f1, a second focal point f2, a long axis 2a, and a short axis 2b, as illustrated in FIG. 10. The first ellipse may correspond to the spheroidal surface that forms the reflective surfaces 911a and 912a.

Assume that a second ellipse has a first focal point f1, a second focal point f2, a long axis 2a', and a short axis 2b'. a' is greater than a, and b' is greater than b. The second ellipse may correspond to the spheroidal surface that forms the reflective surfaces 921a and 922a.

These two dimensional ellipses will be expressed employing a yz orthogonal coordinate system having the midpoint between the first focal point f1 and the second focal point f2 as its origin, an axis that passes through the first focal point f1 and the second focal point f2 as a z axis, and an axis perpendicular to the z axis as a y axis. Note that the z axis direction is a direction from the first focal point f1 to the second focal point f2.

In this case, the coordinates of the first focal point f1 and the second focal point f2 of the first ellipse may be expressed as shown in Formula 1.

$$f1=(-\sqrt{a^2-b^2},0), f2=(\sqrt{a^2-b^2},0) \quad \text{[Formula 1]}$$

The coordinates of the first focal point f1 and the second focal point f2 of the second ellipse may be expressed as shown in Formula 2.

$$f1=(-\sqrt{a'^2-b'^2},0), f2=(\sqrt{a'^2-b'^2},0) \quad \text{[Formula 2]}$$

Accordingly, the first and second ellipses may have focal points at the same positions while being of different sizes, if Formula 3 is satisfied.

$$\sqrt{a^2-b^2}=\sqrt{a'^2-b'^2} \quad \text{[Formula 3]}$$

Formulae 1 through 3 may be expressed in the same manner with respect to three dimensional spheroidal surfaces as well.

Based on the above, it may be possible for the spheroidal surfaces that form the reflective surfaces 911a and 912a as well as the reflective surfaces 921a and 922a to have focal points at substantially the same positions as each other and be of different sizes.

In addition, the pair of first mirrors 911 and 912 may be configured such that each of the reflective surfaces 911a and 912a is exposed to the plasma generating region 25 across the entirety thereof, as illustrated in FIG. 8. Similarly, the pair of second mirrors 921 and 922 may be configured such that each of the reflective surfaces 921a and 922a is exposed to the plasma generating region 25 across the entirety thereof. That is, the pair of first mirrors 911 and 912 as well as the pair of second mirrors 921 and 922 may be configured such that they do not overlap each other.

Particularly, the pair of second mirrors 921 and 922 may be arranged at positions more remote from the plasma generating region 25 where the magnetic field M is generated than the pair of first mirrors 911 and 912. For this reason, there may be a possibility that the pair of first mirrors 911 and 912 will cut off the EUV light 251 that enters the reflective surfaces 921a and 922a.

Accordingly, the shapes, thicknesses, and dimensions of parts of the outer peripheral portions of the pair of first mirrors 911 and 912 which are positioned close to the magnetic field line converging portions of the magnetic field M may be designed such that they do not cut off the EUV light 251 that enters the reflective surfaces 921a and 922a.

The pair of first mirrors 911 and 912 as well as the pair of second mirrors 921 and 922 may be formed such that the sum of the central angles thereof becomes 360 degrees.

Incidentally, the first and second mirror portions 91 and 92 which are included in the EUV light collecting mirror 23 of the first embodiment may be specified from a different viewpoint from that of the description above.

A pair of planes that intersect the EUV light collecting mirror 23 and the central axis X of the magnetic field M and extend along the Z axis that passes through the first focal point F1 and the second focal point F2 are designated as a pair of boundary planes S1 and S2.

The pair of boundary planes S1 and S2 may be boundary planes that demarcate the EUV light collecting mirror 23 into a first portion and a second portion.

Further, in the example of FIG. 8, the pair of boundary planes S1 and S2 may include the Z axis therein, and may intersect each other.

Here, a case in which the pair of boundary planes S1 and S2 demarcate the EUV light collecting mirror 23 of the comparative example will be considered.

In this case, each of the first and second mirror portions 91 and 92 may be specified from the viewpoint of whether the first and second portions of the EUV light collecting mirror 23 of the comparative example demarcated by the pair of boundary planes S1 and S2 is a portion positioned in a space that includes the central axis X of the magnetic field M.

Specifically, a portion, being the first portion or the second portion demarcated in the EUV light collecting mirror 23 of the comparative example, positioned in a space that does not include the central axis X of the magnetic field M may be specified as the first mirror portion 91. The reflective surface 23a of the portion which is specified as the first mirror portion 91 may be specified as a first reflective surface.

A portion, being the first portion or the second portion demarcated in the EUV light collecting mirror 23 of the comparative example, positioned in a space that includes the central axis X of the magnetic field M may be specified as the second mirror portion 92. The reflective surface 23a of the portion which is specified as the second mirror portion 92 may be specified as a second reflective surface.

The portion which is specified as the second mirror portion 92 may be provided to be more remote from the central axis X of the magnetic field M in the reverse direction of the Z axis direction than the portion which is specified as the first mirror portion 91.

Further, the reflective surface 23a which is specified as the second reflective surface may be deformed such that the first and second focal points thereof are at substantially the same positions as the first and second focal points F1 and F2 of the reflective surface 23a which is specified as the first reflective surface. Specifically, the reflective surface 23a which is specified as the second reflective surface may have the first and second focal points F1 and F2, and may be formed by a portion of a spheroidal surface which is larger than a spheroidal surface that forms the reflective surface 23a which is specified as the first reflective surface.

The first and second mirror portions 91 and 92 specified from this viewpoint may be configured in the same manner as the first mirror portion 91 constituted by the pair of first mirrors 911 and 912 as well as the second mirror portion 92 constituted by the pair of second mirrors 921 and 922.

The other structures of the EUV light generating apparatus 1 of the first embodiment may be the same as those of the EUV light generating apparatus 1 of the comparative example.

[4.2 Operation]

The operation of the EUV light generating apparatus 1 of the first embodiment will be described with reference to FIG. 11 and FIG. 12.

Figure 11:
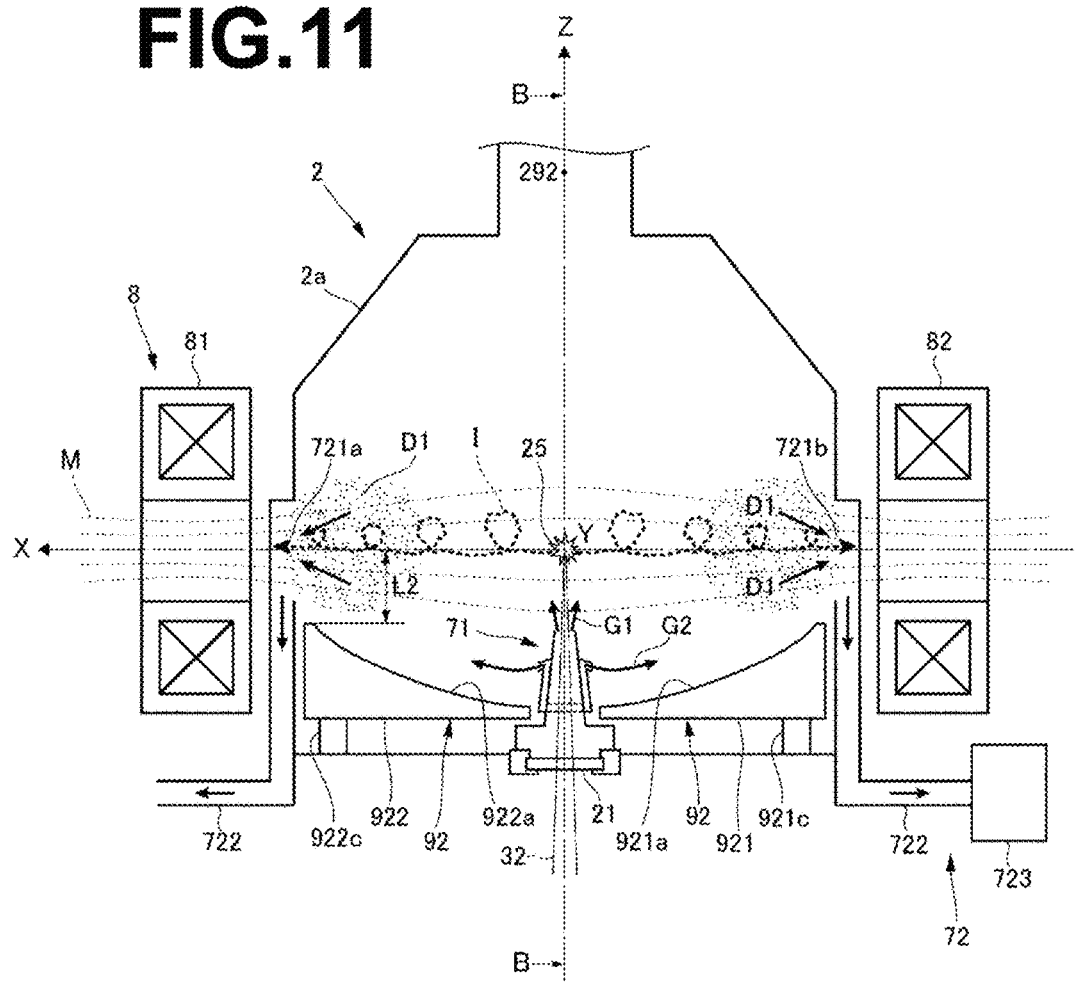
FIG. 11 is a diagram for explaining an EUV light generating apparatus according to a first embodiment, to which the EUV light collecting mirror illustrated in FIG. 6 is applied.

FIG. 11 is a diagram for explaining the EUV light generating apparatus 1 according to the first embodiment, to which the EUV light collecting mirror 23 illustrated in FIG. 6 is applied. FIG. 12 is a cross sectional diagram taken along line B-B of FIG. 11.

Figure 12:
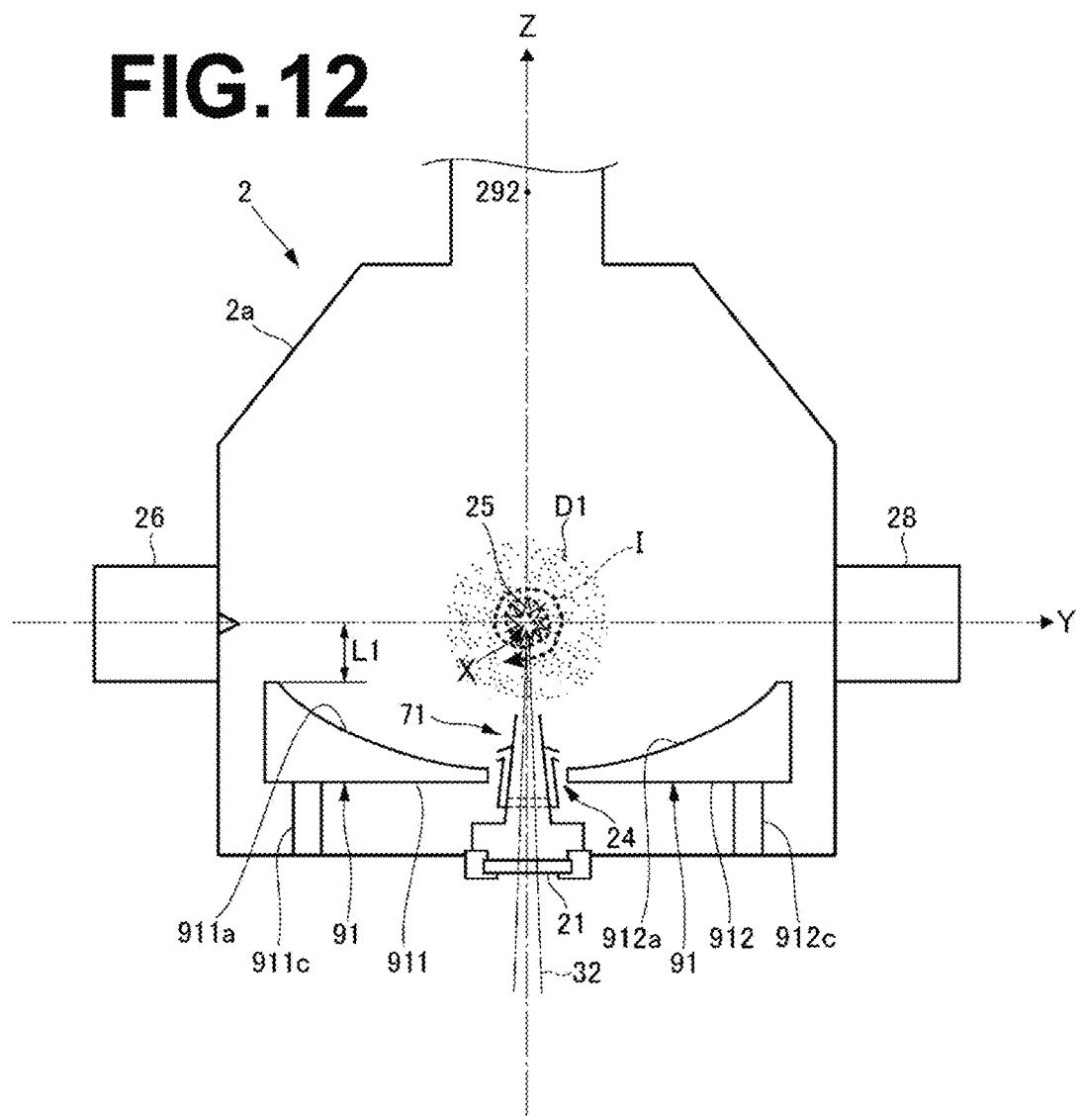
FIG. 12 is a cross sectional diagram taken along line B-B of FIG. 11.

Note that the ducts 713 and 714 which are included in the gas supply unit 71 are omitted from FIG. 11 and FIG. 12.

Descriptions of the operations of the EUV light generating apparatus 1 according to the first embodiment which are the same as those of the EUV light generating apparatus 1 of the comparative example will be omitted.

As described previously, the fine particle debris D1 diffuses form the magnetic field line converging portion of the magnetic field M and may travel toward the EUV collecting mirror 23.

However, the second mirror portion 92 of the EUV light collecting mirror 23 which is in the vicinity of the magnetic field line converging portion of the magnetic field M may be provided remote from the central axis X of the magnetic field M, as illustrated in FIG. 11 and FIG. 12.

For this reason, it is difficult for the fine particle debris D1 to become adhered to the second reflective surface of the second mirror portion 92, and the fine particle debris D1 may travel toward the pair of exhaust ports 721a and 721b along with the gas G2, as illustrated in FIG. 11. Then, the fine particle debris D1 may be exhausted to the exterior of the chamber 2 along with the gases G1 and G2.

Accordingly, it is difficult for the adhered debris D2 to be formed on the EUV light collecting mirror 23 of the first embodiment.

The other operations of the EUV light generating apparatus 1 of the first embodiment may be the same as those of the EUV light generating apparatus 1 of the comparative example.

[4.3 Functions and Effects]

The EUV light collecting mirror 23 of the first embodiment is capable of suppressing the formation of adhered debris D2. Therefore, the EUV light collecting mirror 23 of the first embodiment is capable of suppressing a decrease in the output of the EUV light 252 resulting from a decrease in the reflectance of the EUV light collecting mirror 23.

Thereby, the EUV light generating apparatus 1 of the first embodiment is capable of suppressing an increase in the running cost of the EUV light generating apparatus 1 caused by an increase in the replacement frequency of the EUV light collecting mirror 23.

5. Second Embodiment

An EUV light generating apparatus 1 according to a second embodiment will be described with reference to FIG. 13 and FIG. 14.

The EUV light generating apparatus 1 of the second embodiment may differ from the EUV light generating apparatus 1 of the first embodiment in the configurations of the first and second mirror portions 91 and 92.

Descriptions of the structures in the configuration of the EUV light generating apparatus 1 according to the second embodiment which are the same as those of the EUV light generating apparatus 1 of the first embodiment will be omitted.

[5.1 Configuration]

Figure 13:
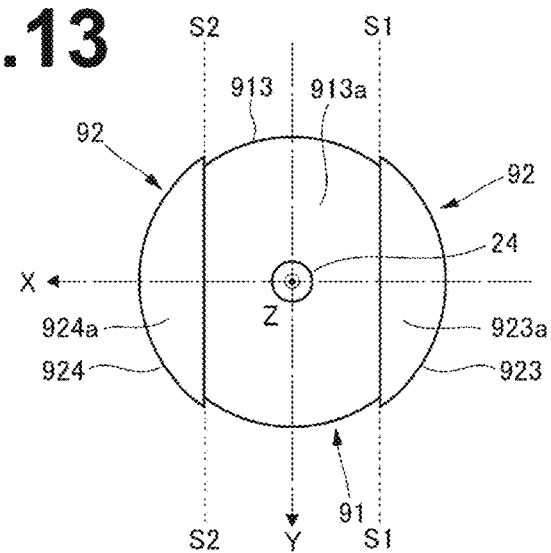
FIG. 13 is a diagram of an EUV light collecting mirror according to a second embodiment as viewed from the reverse direction along the Z axis.

FIG. 13 is a diagram of an EUV light collecting mirror 23 according to the second embodiment as viewed from the reverse direction of the Z axis direction. FIG. 14 is a diagram for explaining the EUV light generating apparatus 1 according to the second embodiment, to which the EUV light collecting mirror 23 illustrated in FIG. 13 is applied.

The EUV light colleting mirror 23 of the second embodiment may include a second mirror portion 92 provided in the vicinity of the magnetic field line converging portion of the magnetic field M, and a first mirror portion 91 separate therefrom.

However, the first mirror portion 91 of the second embodiment may be constituted by one first mirror 913. The first mirror 913 may be provided at the inner side of the wall 2a of the chamber 2 via a first mirror holding units 913c.

The second mirror portion 92 of the second embodiment may be constituted by a pair of second mirrors 923 and 924. The pair of second mirrors 923 and 924 may be provided at the inner side of the wall 2a of the chamber 2 via second mirror holding units 923c and 924c, respectively.

The EUV light collecting mirror 23 of the second embodiment may be constituted by arranging the second mirror 923, the first mirror 913, and the second mirror 924 in this order along the central axis X of the magnetic field M.

The first mirror 913 may be formed to be of a shape in which two substantially bow shaped plates are cut off from a substantially circular plate, as illustrated in FIG. 13. The two substantially bow shaped plates which are cut off may be two outer peripheral edge portions of the first mirror 913, which are positioned in the vicinity of the magnetic field line converging portion of the magnetic field M, in the case that the mirror is formed as a substantially circular plate.

The penetrating aperture 24 may be formed through the central portion of the first mirror 913, in a manner different of the first embodiment.

The outer peripheral edge portion of the first mirror 913 which is the outer peripheral edge portion other than that in the vicinity of the magnetic field line converging portion of the magnetic field M may be formed to be of the same shape as that of the EUV light collecting mirror 23 of the comparative example.

The first mirror 913 may be arranged between the pair of second mirrors 923 and 924 in a direction along the central axis X of the magnetic field M.

The first mirror 913 may be arranged such that the distance in the Z axis direction from the outer peripheral edge portion of a reflective surface 913a to the central axis X is substantially the same as the distance in the Z axis direction from the outer peripheral edge portion 23b to the central axis X in the comparative example. Note that the reflective surface 913a may be the reflective surface of the first mirror 913.

The reflective surface 913a may constitute a first reflective surface, which is the reflective surface of the first mirror portion 91 of the second embodiment.

The reflective surface 913a may be formed by a portion of a spheroidal surface having the first focal point F1 and the second focal point F2 in the same manner as the first embodiment.

The pair of second mirrors 923 and 924 may be formed as substantially bow shaped plates which are the same as each other, as illustrated in FIG. 13.

The pair of second mirrors 923 and 924 may be formed such that the sizes thereof in the radial direction are greater than that of the first mirror 913.

Cutouts may not be formed in the pair of second mirrors 923 and 924, in a manner different from the first embodiment.

The pair of second mirrors 923 and 924 may be arranged such that the respective portions thereof that correspond to bowstrings face each other with the Z axis interposed therebetween. The pair of second mirrors 923 and 924 may be arranged such that the distances from the respective opposing surfaces thereof to the Z axis are substantially the same.

The pair of second mirrors 923 and 924 may be arranged such that the distance in the Z axis direction from the outer peripheral edge portions of reflective surfaces 923a and 924a to the central axis X is greater than the distance in the Z axis direction from the outer peripheral edge portion of the reflective surface 913a to the central axis X, in the same manner as the first embodiment. That is, the pair of second mirrors 923 and 924 may be arranged to be farther from the central axis X of the magnetic field M than the first mirror 913 in the reverse direction of the Z axis direction, in the same manner as the first embodiment. In other words, the reflective surfaces 923a and 924a may be arranged at positions at which the magnetic flux density caused by the magnetic field M is lower than that of the reflective surface 913a, in the reverse direction of the Z axis direction.

Note that the reflective surfaces 923a and 924a may be the reflective surfaces of the pair of second mirrors 923 and 924, respectively.

The reflective surfaces 923a and 924a may constitute a second reflective surface, which is the reflective surface of the second mirror portion 92 of the second embodiment.

The reflective surfaces 923a and 924a may be formed by a portion of a spheroidal surface having the first focal point F1 and the second focal point F2 in the same manner as the first embodiment.

The spheroidal surface that forms the reflective surfaces 923a and 924a may be larger than the spheroidal surface that forms the reflective surface 913a in the same manner as the first embodiment.

In addition, the first mirror 913 as well as the pair of second mirrors 923 and 924 may be configured such that each of the reflective surfaces 913a, 923a, and 924a is exposed to the plasma generating region 25 across the entirety thereof, in the same manner as the first embodiment.

Figure 14:
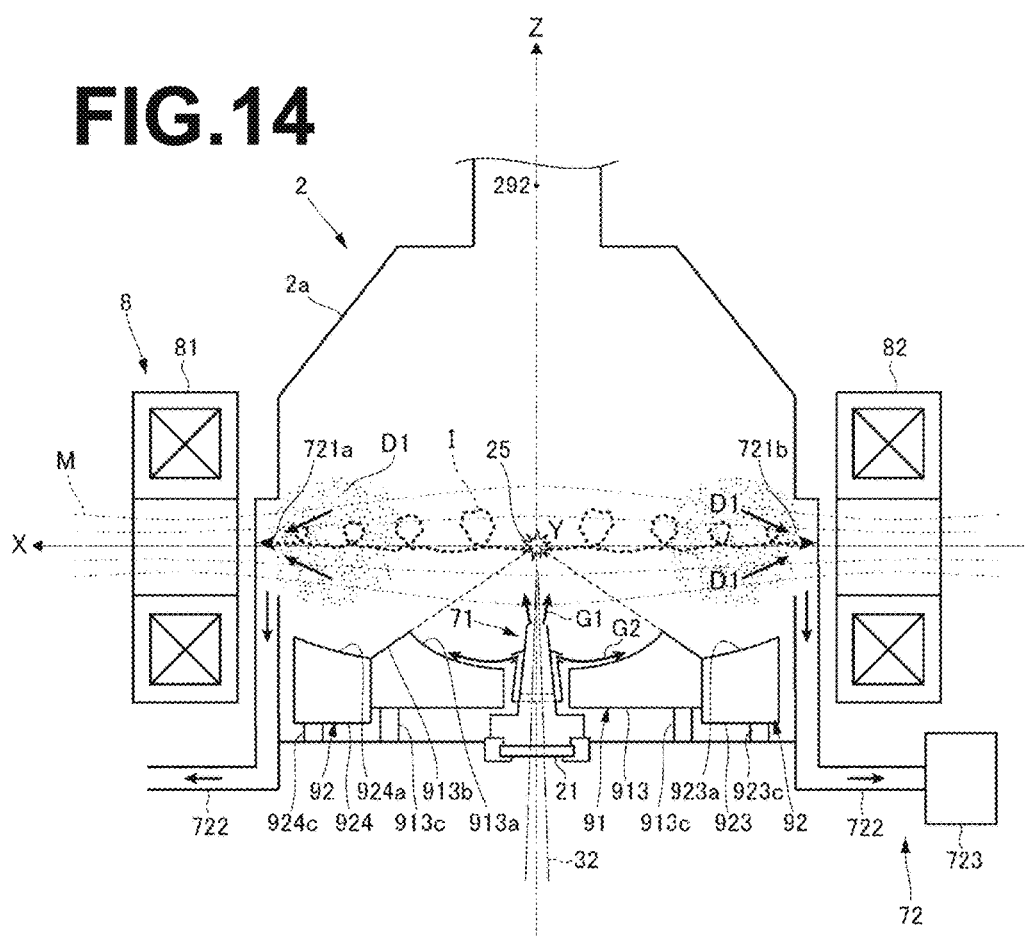
FIG. 14 is a diagram for explaining an EUV light generating apparatus according to a second embodiment, to which the EUV light collecting mirror illustrated in FIG. 13 is applied.

At this time, the shape, thickness, and dimensions of an outer peripheral portion 913b of the first mirror 913 which is positioned in the vicinity of the magnetic field line converging portion of the magnetic field M may be designed so as not to cut off the EUV light 251 that enters the reflective surfaces 923a and 924a, as illustrated in FIG. 14.

Note that the shape, thickness, and dimensions of the outer peripheral portion 913b illustrated in FIG. 14 may also be applied to the pair of first mirrors 911 and 912 of the first embodiment.

The other structures of the first mirror 913 may be the same as those of the pair of first mirrors 911 and 912 of the first embodiment.

Incidentally, the first and second mirror portions 91 and 92 which are included in the EUV light collecting mirror 23 of the second embodiment may also be specified from a viewpoint that employs the pair of boundary planes S1 and S2, in a similar manner as the first embodiment.

As described previously, the pair of boundary planes S1 and S2 may be a pair of planes that intersect the EUV light collecting mirror 23 and the central axis X of the magnetic field M, and may be a pair of planes that extend along the Z axis that passes through the first focal point F1 and the second focal point 2.

Further, in the example of FIG. 13, the pair of boundary planes S1 and S2 may substantially perpendicularly intersect the central axis X of the magnetic field M and may be parallel to each other.

In the case that the EUV light collecting mirror 23 of the comparative example is demarcated by the pair of boundary planes S1 and S2, a portion which is positioned in a space that does not include the magnetic field line converging portion of the magnetic field M may be specified as the first mirror portion 91. The reflective surface 23a of the portion which is specified as the first mirror portion 91 may be specified as a first reflective surface.

A portion which is positioned in a space that includes the magnetic field line converging portion of the magnetic field M may be specified as the second mirror portion 92. The reflective surface 23a of the portion which is specified as the second mirror portion 92 may be specified as a second reflective surface.

The portion which is specified as the second mirror portion 92 may be provided to be more remote from the central axis X of the magnetic field M in the reverse direction of the Z axis direction than the portion which is specified as the first mirror portion 91, in the same manner as the first embodiment.

Further, the reflective surface 23a specified as the second reflective surface may have the first and second focal points F1 and F2, and may be formed by a portion of a spheroidal surface which is larger than a spheroidal surface that forms the reflective surface 23a specified as the first reflective surface, in the same manner as the first embodiment.

The first and second mirror portions 91 and 92 which are specified from this viewpoint may be configured in the same manner as the first mirror portion 91 constituted by the pair of first mirror 913 as well as the second mirror portion 92 constituted by the pair of second mirrors 923 and 924.

The other structures of the EUV light generating apparatus 1 of the second embodiment may be the same as those of the EUV light generating apparatus 1 of the first embodiment.

[5.2 Operation, Functions, and Effects]

In the EUV light collecting mirror 23 of the second embodiment, the second mirror portion 92 in the vicinity of the magnetic field line converging portion of the magnetic field M may be provided remote from the central axis X of the magnetic field M in the same manner as the first embodiment. Therefore, it may be difficult for the fine particle debris D1 to become adhered to the second reflective surface of the second mirror portion 92.

Thereby, the EUV light collecting mirror 23 of the second embodiment is capable of suppressing the formation of the adhered debris D2 and is capable of suppressing a decrease in the output of the EUV light 252 resulting from a decrease in the reflectance of the EUV light collecting mirror 23, in the same manner as the first embodiment.

As a result, the EUV light generating apparatus 1 of the second embodiment is capable of suppressing an increase in the running cost of the EUV light generating apparatus 1 caused by an increase in the replacement frequency of the EUV light collecting mirror 23, in the same manner as the first embodiment.

6. Other Items

It would be clear to those skilled in the art that it is possible to apply the technical features of the embodiments described above, including modifications thereof.

The above description is not intended to be limiting, but to be exemplary. Accordingly, it would be clear to those skilled in the art that various changes and modifications may be made to the embodiments of the present disclosure without departing from the scopes of the appended claims.

The terms which are employed in the present specification and the appended claims are to be interpreted as "not limiting". For example, the terms "include" and "including" are to be interpreted to mean "including the described elements but not limited thereto". The term "have" is to be interpreted to mean "having the described elements but not limited thereto". Further, the indefinite articles "a" and "an", as well as the word "one" in the present specification as well as the appended claims are to be interpreted to mean "at least one" or "one or more".

What is claimed is:

1. An extreme ultraviolet light generating apparatus, comprising:
    a light collecting mirror that reflects and focuses extreme ultraviolet light; and
    a magnet that generates a magnetic field;
    the light collecting mirror including:
    a first mirror portion that includes a first reflective surface which is formed by a portion of a spheroidal surface; and
    a second mirror portion that includes a second reflective surface having a focal point at substantially the same position as a focal point of the first reflective surface, and is formed by a portion of a spheroid surface different from that of the first reflective surface, the second reflective surface being provided at a position at which a magnetic flux density caused by the magnetic field is lower than that of the first reflective surface.

2. An extreme ultraviolet light generating apparatus as defined in claim 1, further comprising:
    a chamber in which the extreme ultraviolet light is generated from plasma which is generated at a plasma generating region in the interior thereof,
    wherein the first and second mirror portions are provided within the chamber such that:
    the first and second reflective surfaces reflect the extreme ultraviolet light, and focus the extreme ultraviolet light at a predetermined focal point at a position farther from the first and second reflective surfaces than the plasma generating region;
    a first focal point of each of the first and second reflective surfaces is positioned at the plasma generating region, while a second focal point of each of the first and second reflective surfaces is positioned at the predetermined focal point; and
    the second reflective surface is provided at a position at which the magnetic flux density is lower than that of the first reflective surface in a direction from the second focal point to the first focal point.

3. An extreme ultraviolet light generating apparatus as defined in claim 2, wherein:
    the magnet is constituted by a pair of magnets which are provided outside a wall of the chamber and face each other with the plasma generating region interposed therebetween;
    the magnetic field causes ions which radiate from the plasma to travel from the plasma generating region toward the wall of the chamber at which the pair of magnets are provided; and
    the first and second mirror portions are arranged such that the distance, in the direction of an axis that passes through the first and second focal points, from a central axis of the magnetic field to the second reflective surface is greater than the distance from the central axis of the magnetic field to the first reflective surface.

4. An extreme ultraviolet light generating apparatus as defined in claim 3, wherein:
    the first and second mirror portions are configured such that each of the first and second reflective substances is exposed to the plasma generating region across the entirety thereof.

5. An extreme ultraviolet light generating apparatus as defined in claim 3, wherein:
    the second mirror portion is constituted by a pair of second mirrors which are arranged along the central axis of the magnetic field.

6. An extreme ultraviolet light generating apparatus as defined in claim 5, wherein:
    the first mirror portion is constituted by a pair of first mirrors which are arranged between the pair of second mirrors in a direction along the central axis of the magnetic field.

7. An extreme ultraviolet light generating apparatus as defined in claim 5, wherein:
    the first mirror portion is constituted by one first mirror which is arranged between the pair of second mirrors in a direction along the central axis of the magnetic field.

8. An extreme ultraviolet light generating apparatus as defined in claim 5, further comprising:
    a pair of exhaust ports which are provided to face each other in a wall of the chamber that intersects with the central axis of the magnetic field, configured to exhaust the ions to the exterior of the chamber; wherein:
    the magnetic field causes the ions to travel from the plasma generating region toward each of the pair of exhaust ports.

* * * * *